United States Patent [19]
Kyung

[11] Patent Number: 5,982,222
[45] Date of Patent: Nov. 9, 1999

[54] HIGH VOLTAGE GENERATING CIRCUIT FOR A SEMICONDUCTOR MEMORY DEVICE

[75] Inventor: Kye-Hyun Kyung, Ahnyang, Rep. of Korea

[73] Assignee: Samsung Electronics, Co., Ltd., Suwon, Rep. of Korea

[21] Appl. No.: 08/770,626

[22] Filed: Dec. 19, 1996

[30] Foreign Application Priority Data

Dec. 30, 1995 [KR] Rep. of Korea ............... 95-67794

[51] Int. Cl.[6] ................ G05F 1/10; G05F 3/02
[52] U.S. Cl. ................................................ 327/536
[58] Field of Search ........................... 327/126, 148, 327/157, 536, 537, 589, 538, 540, 541, 544, 390

[56] References Cited

U.S. PATENT DOCUMENTS

| | | | |
|---|---|---|---|
| 5,381,051 | 1/1995 | Morton | 327/589 |
| 5,426,333 | 6/1995 | Maeda | 327/536 |
| 5,561,385 | 10/1996 | Choi | 327/536 |
| 5,642,073 | 6/1997 | Manning | 327/536 |
| 5,781,494 | 7/1998 | Bae et al. | 365/230.03 |

*Primary Examiner*—My-Trang Nu Ton
*Attorney, Agent, or Firm*—Marger Johnson & McCollom, P.C.

[57] ABSTRACT

A high voltage generating circuit for a semiconductor memory device includes a plurality of charge pumps which are connected to a common output line and repetatively activated in sequence. Each pump operates for a predetermined on time after it is activated. In standby mode, the pumps are activated at a low frequency so that the amount of time between the activation of successive pumps is longer than the predetermined on time, and thus, each pump is deactivated before the next pump is activated. This results in only a small amount of charge being transferred to the output line during standby mode. In active mode, the pumps are activated at a higher frequency such that the on times of the individual pumps overlap and several pumps operate simultaneously. Thus, a larger amount of charge is transferred during active mode. Since the individual pumps are activated at different times, power supply noise is reduced.

20 Claims, 7 Drawing Sheets

HIGH VOLTAGE GENERATING CIRCUIT FOR A SEMICONDUCTOR MEMORY DEVICE

This application corresponds to Korean patent application No. 67794/1995 filed Dec. 30, 1995 in the name of Samsung Electronics Co., Ltd., from which priority is claimed.

BACKGROUND OF THE INVENTION

1. Field of the Invention

The present invention relates generally to semiconductor memory devices, and more particularly to a circuit for generating a high voltage power supply in a semiconductor memory device.

2. Description of the Prior Art

As semiconductor memory devices become more highly integrated, lower operating supply voltages must be used to reduce stress on circuits and elements resulting from high electric fields from the power supply. However, even memory devices that operate at reduced power supply voltages often require a high voltage power supply for certain circuits and operations such as driving a word line during an enable operation and driving an isolation gate control signal which is used to selectively switch isolation gates in memory devices having a charge sharing sense amplifier configuration.

Various pumping circuits for generating high voltages have been developed. The circuits are generally classified into two types: standby pumping circuits which supply small amounts of current at a high voltage level, and active pumping circuits which typically supply larger amounts of current at high voltages than the standby circuits, since the amount of charge used by a semiconductor memory device in active mode is typically larger than that used in standby mode.

Figure 1:
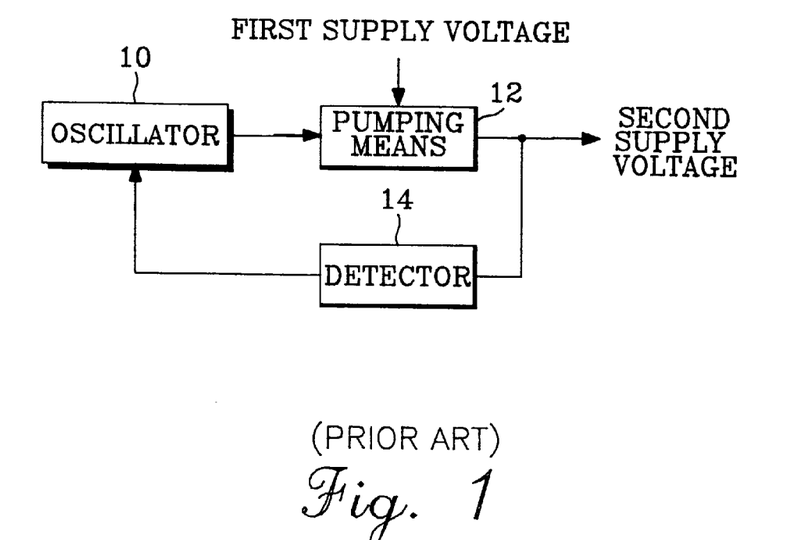
FIG. 1 is a block diagram of a prior art high voltage generating circuit for use in standby mode in a semiconductor memory device.

FIG. 1 is a block diagram of a conventional high-voltage generating circuit (also called a pumping voltage generating circuit) for use in standby mode in a semiconductor memory device. As shown in FIG. 1, a conventional standby high voltage generating circuit includes an oscillator 10, and pumping means 12 having an input terminal connected to an output terminal of the oscillator 10. The pumping means 12 also has a voltage terminal for inputting a first (or internal) supply voltage which is used as the operating power supply for the chip. The pumping means 12 has an output terminal for outputting a second supply voltage or desired high voltage which is higher in level than the external supply voltage. The conventional standby high voltage generating circuit further includes a detector 14 connected in a feedback manner between the output terminal of the pumping means 12 and an input terminal of the oscillator 10.

In operation, the pumping means 12 (typically a charge pump) boosts the voltage of the first power supply signal to a higher voltage second power supply voltage signal in response to a train of periodic pulses generated by oscillator 10. The detector 14 detects the voltage level of the second power supply signal and, in accordance with the detected signal, controls the oscillator to prevent the second power supply voltage level from exceeding a predetermined level. Thus, the circuit of FIG. 1 pumps the first power supply voltage to a second power supply voltage in a standby mode.

Figure 2:
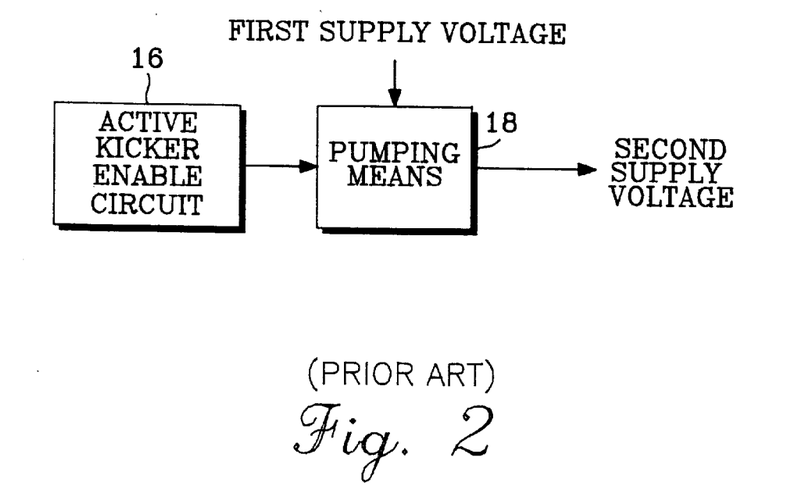
FIG. 2 is a block diagram of a prior art high voltage generating circuit for use in active mode in a semiconductor memory device.

FIG. 2 is a block diagram of a conventional high voltage generating circuit for a use in active mode in a semiconductor memory device. As shown in this drawing, the conventional active high voltage generating circuit includes an active kicker enable circuit 16, and pumping means 18 having an input terminal connected to an output terminal of the active kicker enable circuit 16. The pumping means 18 also has a voltage terminal for inputting a first (or internal) supply voltage which is used as the operating power supply for the chip. The pumping means 18 has an output terminal for outputting a second supply voltage or desired high voltage which is higher in level than the external supply voltage.

In operation, the active kicker enable circuit 16 generates a master clock signal at a frequency in accordance with the demands of the circuits in the semiconductor memory device which require a high voltage supply. The pumping means (charge pump) 18 boosts the voltage level of the first power supply signal to the voltage level of the second power supply signal in response to the master clock signal from the active kicker enable circuit 16. As a result, the circuit of FIG. 2 supplies a large amount of charge at a high voltage level to the semiconductor memory device in the active mode. The amount of charge supplied is determined in accordance with the demands of the semiconductor memory device.

The construction and operation of the prior art standby and active pumping generating circuits of FIGS. 1 and 2 are well-known, and thus will not be described further.

However, the prior art high voltage generating circuits have several disadvantages. First, since the amount of charge required in active mode is significantly greater than the amount required in standby mode, two separate circuits must be used to generate the high voltage power supply during the two separate modes of operation.

Second, the large capacity active high voltage generating circuit increases power supply noise because it is operated in response to one master clock which results in large amounts of charge being temporarily charged and discharged.

Third, the pumping means in the active high voltage generating circuit includes a large capacity capacitor for supplying large amounts of current. The charging and discharging of this capacitor reduces the pumping efficiency and reduces the level of integration of the semiconductor memory device.

Fourth, because the large capacitor is activated for pumping operation, the pumping time increases thereby resulting in a degradation of high speed operation.

SUMMARY OF THE INVENTION

It is therefore an object of the present invention to provide a high voltage generating circuit for a semiconductor memory device which is capable of operating in both standby and active modes.

Another object of the present invention is to reduce the size of the capacitors required for a high voltage generating circuit for a semiconductor memory device so as to increase the pumping efficiency.

A further object of the present invention is to reduce power supply noise in a semiconductor memory device.

Another object of the present invention is to increase the operating speed of a semiconductor memory device.

Yet another object of the present invention is to increase the integration level of a semiconductor memory device.

To achieve these and other objects, a high voltage generating circuit in accordance with the present invention employs a plurality of charge pumping circuits which are coupled to an output line and repetatively activated in sequence. Each pump operates for a predetermined on time after it is activated. In standby mode, the pumps are activated at a low frequency so that the amount of time between the activation of successive pumps is longer than the predetermined on time, and thus, each pump is deactivated before the next pump is activated. This results in only a small amount of charge being transferred to the output line during standby mode. In active mode, the pumps are activated at a higher frequency such that the on times of the individual pumps overlap and several pumps operate simultaneously. Thus, a larger amount of charge is transferred during active mode. Since the individual pumps are activated at different times, power supply noise is reduced.

One aspect of the present invention is a method for generating a high voltage power supply in a semiconductor memory device comprising the steps of operating one pumping circuit during a standby mode to transfer charge to an output line; and operating a plurality of pumping circuits during an active mode to transfer charge to the output line. The plurality of pumping circuits are activated in a sequential manner.

Another aspect of the present invention is a method for generating a high voltage power supply in a semiconductor memory device comprising: sequentially activating a plurality of pumping circuits; sequentially deactivating the plurality of pumping circuits; and increasing the frequency at which the pumping circuits are activated during an active mode. The frequency at which the pumping circuits are activated is decreased during a standby mode.

Another aspect of the present invention is a circuit for generating a high voltage power supply in a semiconductor memory device, the circuit comprising two or more pumping circuits coupled to an output line, wherein one of the pumping circuits transfers charge to the output line during a standby mode, and at least two of the pumping circuits transfer charge to the output line during an active mode. Each of the pumping circuits transfers charge to the output line responsive to one of a plurality of enable signals. The circuit includes an enable signal generating circuit coupled to the pumping circuits for generating the plurality of enable signals. The enable signal generating circuit includes a shift register coupled to the pumping circuits to activate the enable signals in sequence.

An advantage of the present invention is that a single high voltage generating circuit can be used to supply a high voltage signal in both standby and active modes in a semiconductor memory device.

Another advantage of the present invention is that it does not require a large capacity capacitor. This prevents the abrupt charging and discharging, thereby significantly reducing power supply noise.

A further advantage of the present invention is that it employs small capacitors which increased the pumping efficiency as well as the level of integration of the semiconductor memory device. The use of small capacitors also reduces the pumping time, thereby improving high speed operation.

The foregoing and other objects, features and advantages of the invention will become more readily apparent from the following detailed description of a preferred embodiment of the invention which proceeds with reference to the accompanying drawings.

DETAILED DESCRIPTION

Figure 3:
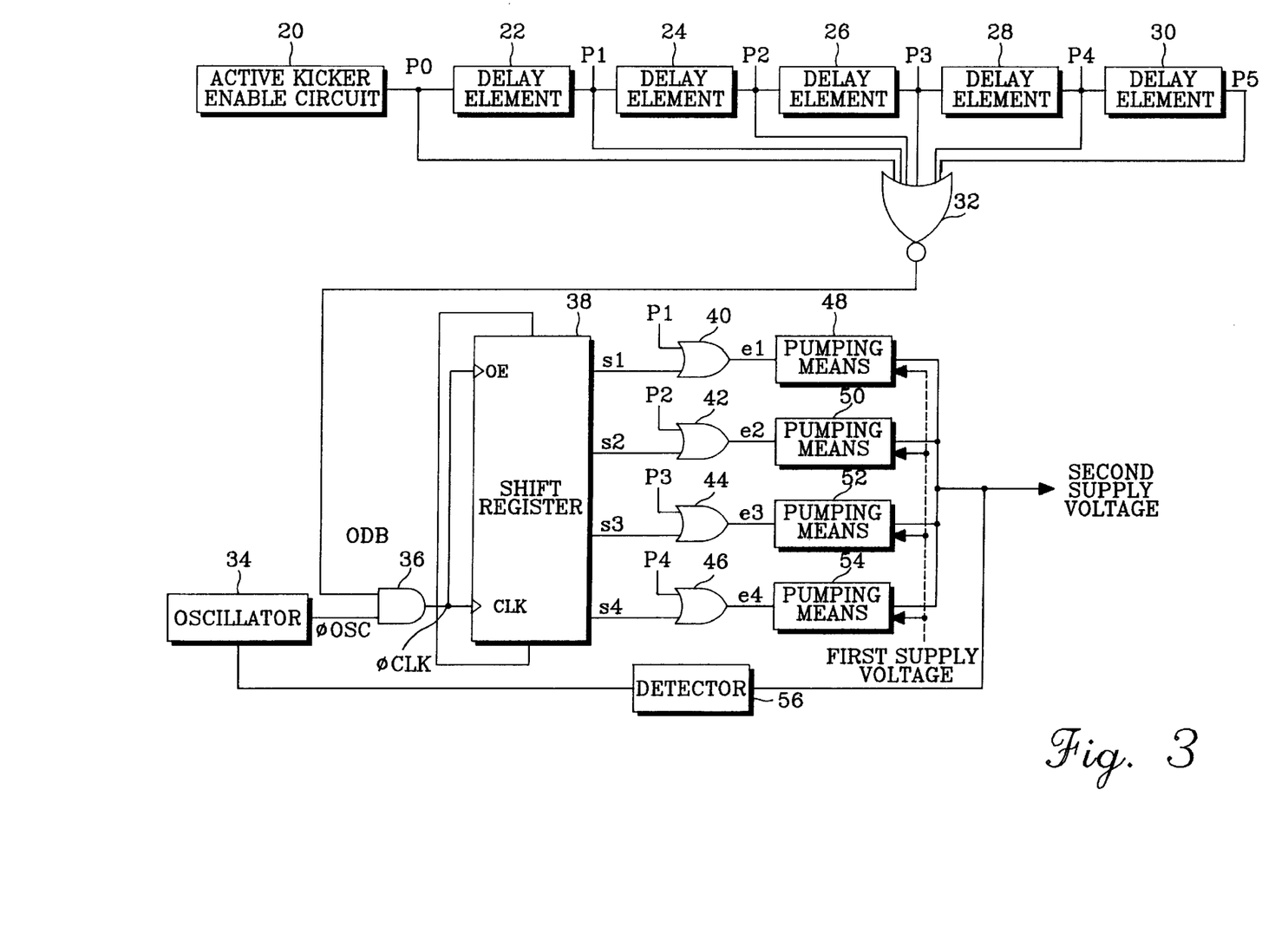
FIG. 3 is a block diagram of a first embodiment of a high voltage generating circuit in accordance with the present invention.

FIG. 3 is a block diagram of a first embodiment of a high voltage generating circuit in accordance with the present invention. The circuit of FIG. 3 includes an active kicker enable circuit 20 for generating a pulse signal P0 at its output terminal which is connected in common to an input terminal of a delay element 22 and a first input terminal of a first gating means or NOR gate 32. The delay element 22 outputs a pulse signal P1 at its output terminal which is connected in common to an input terminal of a delay element 24 and a second input terminal of the NOR gate 32. The delay element 24 outputs a pulse signal P2 at its output terminal which is connected in common to an input terminal of a delay element 26 and a third input terminal of the NOR gate 32. The delay element 26 outputs a pulse signal P3 at its output terminal which is connected in common to an input terminal of a delay element 28 and a fourth input terminal of the NOR gate 32. The delay element 28 outputs a pulse signal P4 at its output terminal which is connected in common to an input terminal of a delay element 30 and a fifth input terminal of the NOR gate 32. The delay element 30 outputs a pulse signal P5 at its output terminal which is connected to a sixth input terminal of the NOR gate 32. The first gating means or NOR gate 32 generates a control signal ODB at its output terminal which is connected to a first input terminal of a second gating means or AND gate 36.

The high voltage generating circuit further includes an oscillator 34 for generating an output signal φOSC in the form of a pulse train at its output terminal which is connected to a second input terminal of the AND gate 36. The AND gate 36 outputs a clock signal φCLK at its output terminal which is connected in common to an output enable terminal OE and a clock input terminal CLK of a shift register 38. The shift register 38 generates output signals s1–s4 at its output terminals which are connected to the second input terminals of OR gates 40–46, respectively. The first input terminals of OR gates 40–46 receive the pulse signals P1–P4 from the delay elements 22–28, respectively. The OR gates 40–46 generate enable signals e1–e4, respectively, at their output terminals which are connected to input terminals of pumping means 48–54, respectively.

The NOR gate 32, AND gate 36, shift register 38 and OR gates 40–46 operate so as to control the pumping means 48–54. The pumping means 48–54 have voltage terminals for inputting a first supply voltage or internal supply voltage which is used as an operating power supply in a chip. The pumping means 48–54 also have output terminals which are commonly connected to output a second supply voltage, or pumped voltage, which is higher in level than an external supply voltage.

The high voltage generating circuit further includes a detector 56 connected in a feedback manner between the output terminals of the pumping means 48–54 and an input terminal of the oscillator 34. More specifically, the detector 56 has an input terminal connected in common to the output terminals of the pumping means 48–54, and an output terminal connected to the input terminal of the oscillator 34.

Figure 4:
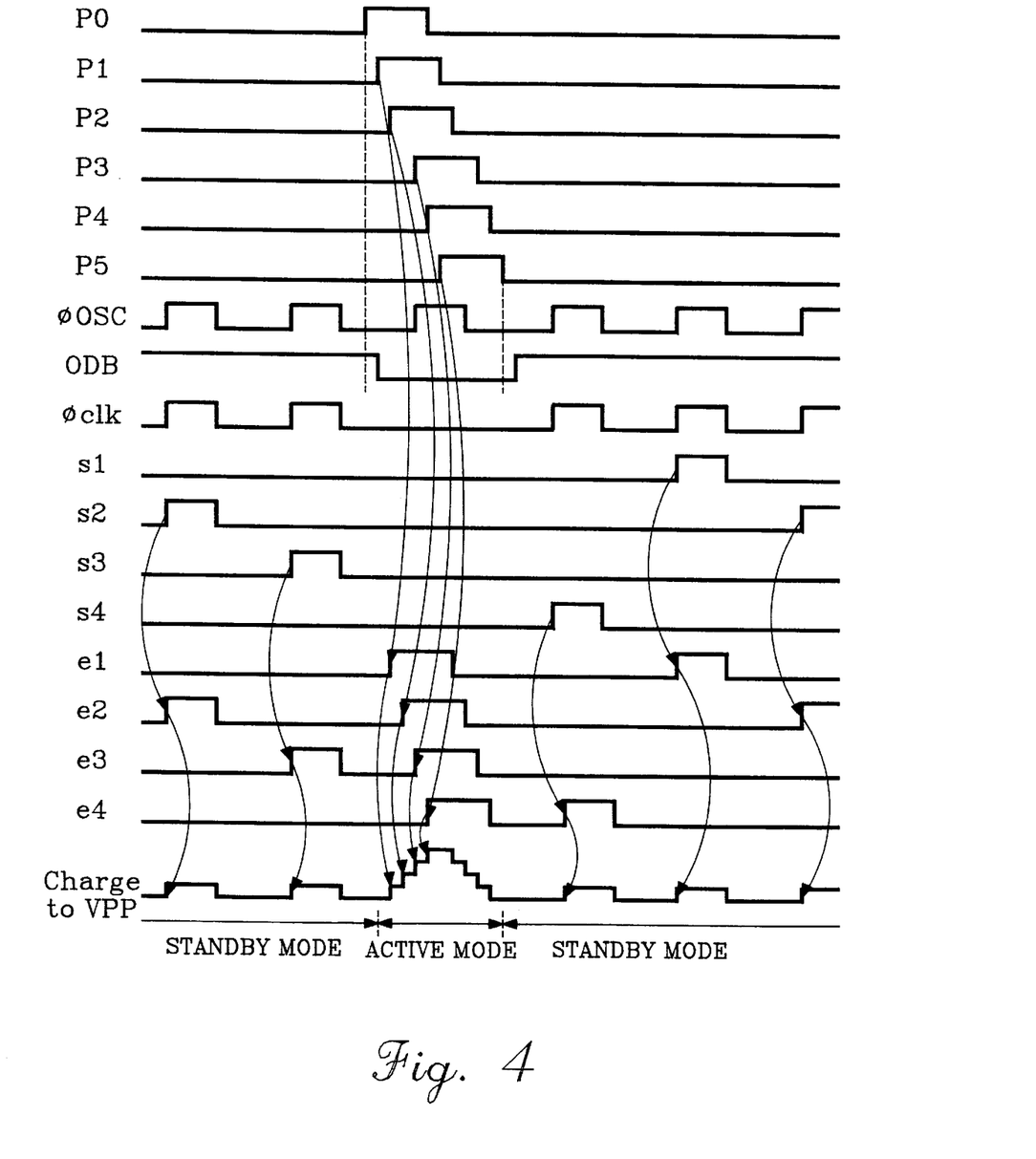
FIG. 4 is a timing diagram illustrating the operation of the circuit of FIG. 3.

The operation of the circuit of FIG. 3 will now be described with reference to FIG. 4 which is a timing diagram illustrating the operation of the circuit of FIG. 3 in both standby mode and active mode.

In standby mode, the output signals from the active kicker enable circuit 20 and delay elements 22–30 are all at a low logic level. As a result, the control signal ODB, which is the output signal from the NOR gate 32, remains at a high logic state. In this state, the oscillator 34 generates an output signal φOSC in the form of pulse train, and the AND gate 36 generates a clock signal φCLK with the same pulse train waveform as that of the output signal φOSC from the oscillator 34. Then, the shift register 38 generates output signals corresponding to the output signal φCLK from the AND gate 36. That is, the shift register 38 enables its output signals s2 and s3, as shown in FIG. 4, which are then applied respectively to the OR gates 42 and 44 an logically combined with the pulse signals P2 and P3 from the delay elements 24 and 26. In accordance with the logically combined results, the OR gates 42 and 44 output the enable signals e2 and e3 respectively to the pumping means 50 and 52. As a result, the pumping means 50 and 52 pump the first supply voltage to the second supply voltage.

Thus, in standby mode, each of the pumping means are activated in sequence. However, the frequency of activation is low enough that each pumping means is deactivated before the next pumping means is activated.

In active mode, the active kicker enable circuit 20 generates the pulse signal P0, thereby causing the delay elements 22–30 to generate the pulse signals P1–P5. In response to the pulse signals P0–P5 from the active kicker enable circuit 20 and delay elements 22–30, the NOR gate 32 generates the control signal ODB which remains at its low logic state for a predetermined time period. The active kicker enable circuit 20 is designed to generate a master clock with a pulse duration which is longer than that of the delay means with the longest delay time. As a result, the control signal ODB from the NOR gate 32 remains at its low logic state from the low to high transition of the pulse signal P0 from the active kicker enable circuit 20 until the high to low transition of the pulse signal P5 from the delay element 30, to stop the operation of the shift register 38. This causes the output signals s1–s4 from the shift register 38 remain at their low logic state. On the other hand, the OR gates 40–46 logically combine the pulse signals P1–P4 from the delay elements 22–28 with the output signals s1–s4 from the shift register 38, respectively. In accordance with the logically combined results, the OR gates 40–46 generate their output signals e1–e4 corresponding respectively to the pulse signals P1–P4 from the delay elements 22–28. As a result, all four of the pumping means 48–54 perform the pumping operation in an overlapping manner to pump the first supply voltage to the second supply voltage, so as to transfer a large amount of charge to an output line.

Thus, in active mode, each of the pumping means are activated in sequence. However, the frequency of activation is increased from that used in standby mode to the point that each successive pumping means is not deactivated until after the next pumping means has been activated. In the example of FIG. 4, there is a time during which all four pumping means are actally operating simultaneously, thereby transfering a large amount of charge to the output line.

An advantage of this technique is that it allows a single circuit to transfer a large amount of charge during active mode, and a smaller amount of charge during standby mode. Another advantage is that, as can be seen from FIG. 4, each of the pumping means turns on at a different time rather than all at once. This eliminates the noise that would be generated by the current surge that would occur if all of the pumping means were activated at once.

Figure 5:
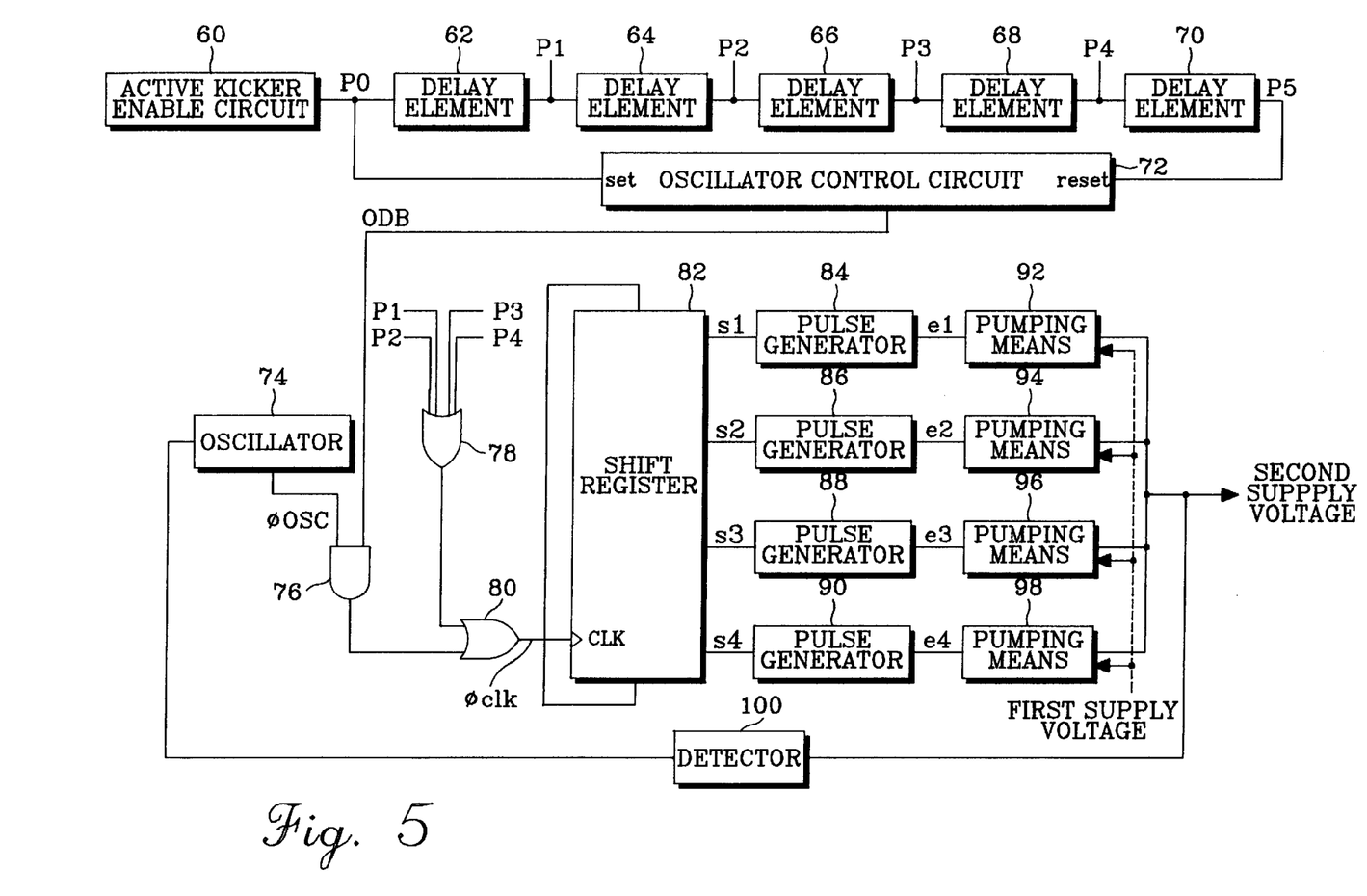
FIG. 5 is a block diagram of a second embodiment of a high voltage generating circuit in accordance with the present invention.

FIG. 5 is a block diagram of a second embodiment of a high voltage generating circuit in accordance with the present invention. As shown in FIG. 5, the high voltage generating circuit includes an active kicker enable circuit 60 for generating a pulse signal P0 at an output terminal which is connected in common to an input terminal of a delay element 62 and a set terminal of an oscillator control circuit 72. The delay element 62 outputs a pulse signal P1 at its output terminal which is connected to an input terminal of a delay element 64. The delay element 64 outputs a pulse signal P2 at its output terminal which is connected to an input terminal of a delay element 66. The delay element 66 outputs a pulse signal P3 at its output terminal which is connected to an input terminal of a delay element 68. The delay element 68 outputs a pulse signal P4 at its output terminal which is connected to an input terminal of a delay element 70. The delay element 70 outputs a pulse signal P5 at its output terminal which is connected to a reset terminal of the oscillator control circuit 72. The oscillator control circuit 72 generates a control signal ODB at its output terminal which is connected to a first input terminal of first gating means or AND gate 76.

The high voltage generating circuit further includes an oscillator 74 for generating an output signal φOSC in the form of a pulse train at its output terminal which is connected to a second input terminal of the AND gate 76. A second gating means or OR gate 78 having four input terminals for inputting the pulse signals P1–P4 from the delay elements 62–68, respectively. A third gating means or OR gate 80 has first and second input terminals connected respectively to output terminals of the OR gate 78 and AND gate 76. The OR gate 80 outputs a clock signal φCLK at its output terminal which is connected to a clock input terminal CLK of a shift register 82. The shift register 82 generates output signals s1–s4 at its output terminals which are connected respectively to input terminals of pulse generators 84–90. The pulse generators 84–90 generate enable signals e1–e4 respectively at their output terminals which are connected respectively to input terminals of pumping means 92–98.

The oscillator control circuit 72, AND gate 76, OR gates 78 and 80, shift register 82 and pulse generators 84–90 are operated to control the pumping means 92–98. The pumping means 92–98 have voltage terminals for commonly inputting a first supply voltage or internal supply voltage which is used as the operating power supply in a chip. The pumping means 92–98 also have output terminals which are commonly connected to output a second supply voltage, or pumped voltage, which is higher in level than an external supply voltage.

The high voltage generating circuit further includes a detector 100 connected in a feedback manner between the output terminals of the pumping means 92–98 and an input terminal of the oscillator 74. More specifically, the detector 100 has an input terminal connected to the output terminals of the pumping means 92–98, and an output terminal connected to the input terminal of the oscillator 74.

Figure 6:
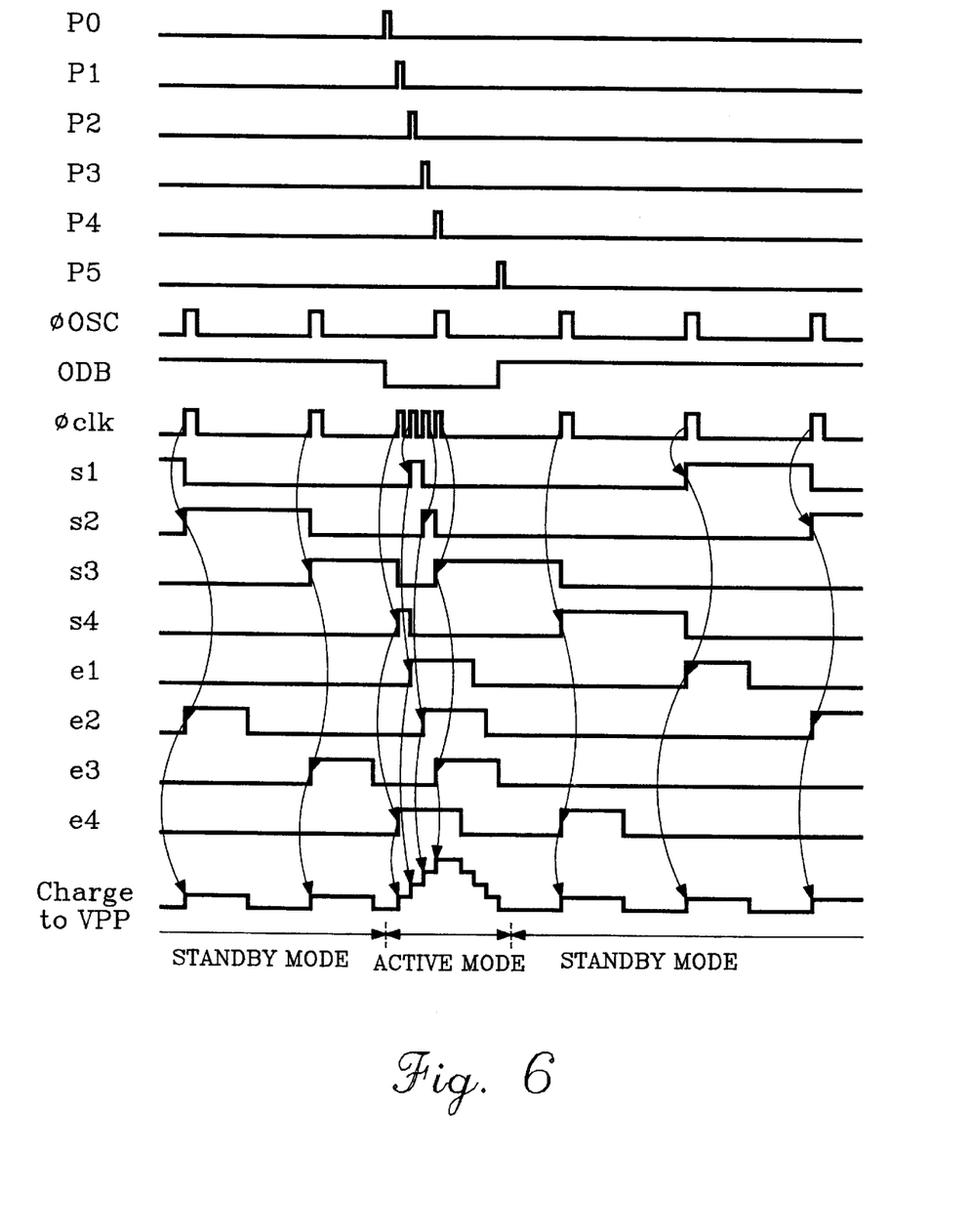
FIG. 6 is a timing diagram illustrating the operation of the circuit of FIG. 5.

The operation of the circuit of FIG. 5 will now be described with reference to FIG. 6 which is a timing diagram illustrating the operation of the circuit of FIG. 5 in both standby mode and active mode.

In standby mode, the output signals from the active kicker enable circuit 60 and delay elements 62–70 are all at a low logic level. As a result, the control signal ODB or output signal from the oscillator control circuit 72 remains at its high logic state. In this state, the oscillator 74 generates the output signal φOSC in the form of a pulse train, and the AND gate 76 generates an output signal with the same pulse train waveform as that of the output signal φOSC from the oscillator 74. Also, the output signal from the OR gate 78 remains at its low logic state because the output signals from the delay elements 62–68 are all low. As a result, the OR gate 80 generates the clock signal φCLK with the same pulse train waveform as that of the output signal from the AND gate 76. Then, the shift register 82 generates its output signals corresponding to the output signal φCLK from the OR gate 80. That is, in response to the output signal φCLK from the OR gate 80, the shift register 82 enables its output signals s2 and s3, as shown in FIG. 6, which are then applied respectively to the pulse generators 86 and 88. In response to the output signals s2 and s3 from the shift register 82, the pulse generators 86 and 88 output the enable signals e2 and e3 respectively to the pumping means 94 and 96. As a result, the pumping means 94 and 96 pump the first supply voltage to the second supply voltage.

Thus, in standby mode, each of the pumping means are activated in sequence. However, the frequency of activation is low enough that each pumping means is deactivated before the next pumping means is activated.

In active mode, the active kicker enable circuit 60 generates the pulse signal P0, 10 thereby causing the delay elements 62–70 to generate the pulse signals P1–P5. The pulse signals P0 and P5 from the active kicker enable circuit 60 and delay element 70 are applied to the set and reset terminals of the oscillator control circuit 72, respectively. As a result, the oscillator control circuit 72 generates the control signal ODB which remains at its low logic state for a predetermined time period. The active kicker enable circuit 60 is designed to generate a master clock with a pulse duration which is shorter than that of the delay means with the shortest delay time. As a result, the control signal ODB from the oscillator control circuit 72 remains at its low logic state from the low to high transition of the pulse signal P0 from the active kicker enable circuit 60 until the high to low transition of the pulse signal P5 from the delay element 70, to stop the operation of the shift register 82. Also, the OR gate 78 logically combines the pulse signals P1–P4 from the delay elements 62–68 and transfers the logically combined result to the clock input terminal of the shift register 82. Then, the shift register 82 sequentially outputs the output signals s1–s4 which are all high in logic. The pulse generators 84–90 generate their enable signals e1–e4 corresponding respectively to the output signals s1–s4 from the shift register 82. As a result, the pumping means 92–98 perform the pumping operation four times to pump the first supply voltage to the second supply voltage, so as to transfer a large amount of charge to an output line.

Thus, in active mode, each of the pumping means are activated in sequence. However, the frequency of activation is increased from that used in standby mode to the point that each successive pumping means is not deactivated until after the next pumping means has been activated. In the example of FIG. 6, there is a time during which all four pumping means are actally operating simultaneously, thereby transfering a large amount of charge to the output line.

Figure 7:
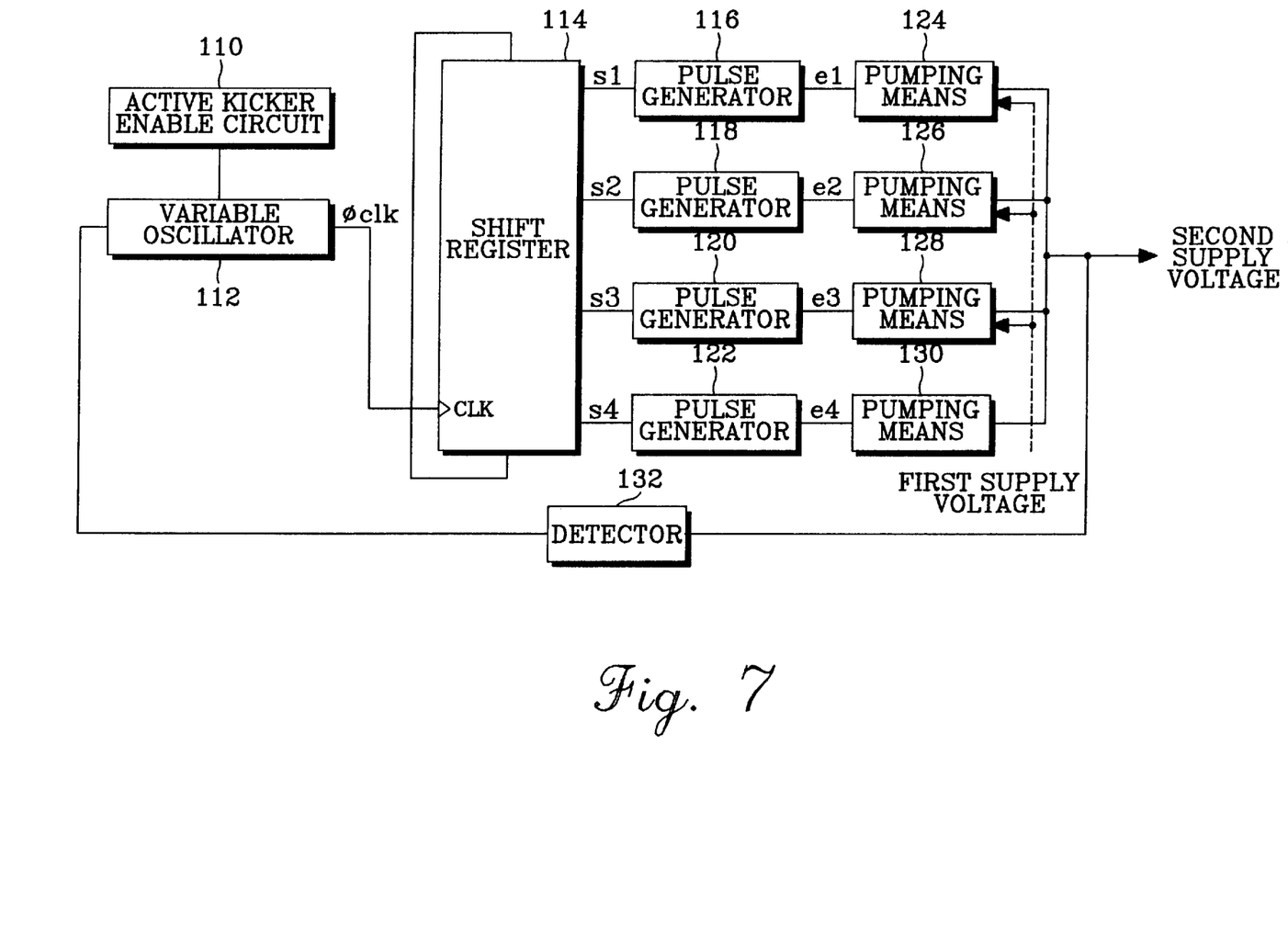
FIG. 7 is a block diagram of a third embodiment of a high voltage generating circuit in accordance with the present invention.

FIG. 7 is block diagram of a third embodiment of a high voltage generator circuit in accordance with the present invention. As shown in FIG. 7, the high voltage generating circuit comprises an active kicker enable circuit 110 having an output terminal connected to a first input terminal of a variable oscillator 112. The variable oscillator 112 generates a clock signal φCLK at its output terminal which is connected to a clock input terminal CLK of a shift register 114. The shift register 114 generates output signals s1–s4 at its output terminals which are connected respectively to input terminals of pulse generators 116–122. The pulse generators 116–122 generate enable signals e1–e4 respectively at their output terminals which are connected respectively to input terminals of pumping means 124–130.

The shift register 114 and pulse generators 116–122 are operated to control the pumping means 124–130 in response to the clock signal φCLK from the variable oscillator 112. The pumping means 124–130 have voltage terminals for commonly inputting a first supply voltage or internal supply voltage which is used as the operating power supply in a chip. Further, the pumping means 124–130 have output terminals for commonly outputting a second supply voltage or pumped voltage which is higher in level than an external supply voltage.

The high voltage generating circuit further includes a detector 132 connected in a feedback manner between the output terminals of the pumping means 124–130 and a second input terminal of the variable oscillator 112. More specifically, the detector 132 has an input terminal connected in common to the output terminals of the pumping means 124–130 and an output terminal connected to the second input terminal of the variable oscillator 112.

Figure 8:
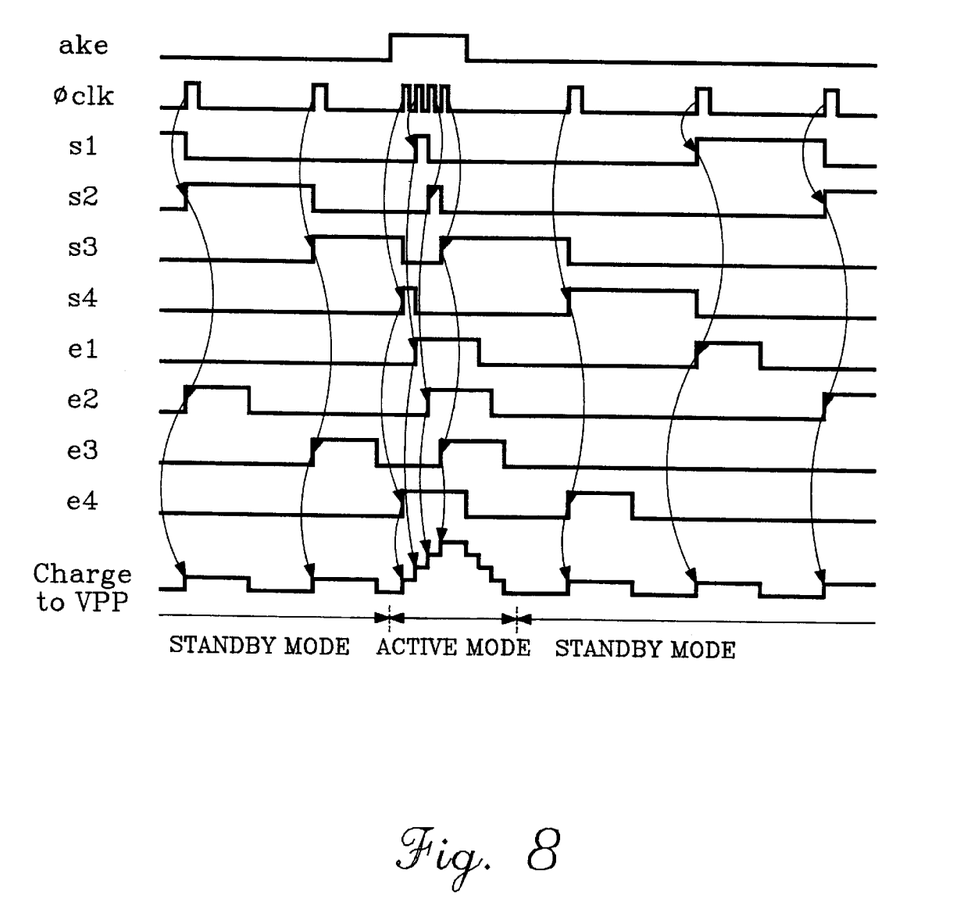
FIG. 8 is a timing diagram illustrating the operation of the circuit of FIG. 7.

The operation of the circuit of FIG. 7 will now be described with reference to FIG. 8 which is a timing diagram illustrating the operation of the circuit of FIG. 7 in both standby mode and active mode. In the third embodiment of FIG. 7, the variable oscillator 112 is designed to generate the clock signal φCLK with a variable pulse duration. That is, the clock signal φCLK from the variable oscillator 112 has a longer pulse duration in standby mode and a shorter pulse duration in active mode. As a result, the pumping operation is performed once in the standby mode to supply a pumped voltage to an output line. In the active mode, the pumping operation is successively performed four times to supply a large amount of charge to the output line. The remaining operation of the third embodiment in FIG. 7 is substantially the same as those of the first and second embodiments in FIGS. 3 and 5 and a description thereof will thus be omitted.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A high voltage generating circuit for a semiconductor memory device, comprising:

an active kicker enable circuit for generating a master clock signal in an active mode;

a plurality of delay elements coupled to the active kicker enable circuit for sequentially performing a delay operation for a time period in response to an output signal from said active kicker enable circuit;

an oscillator for generating a pulse signal at a desired period;

pumping drive means coupled to the active kicker enable circuit, the oscillator, and the plurality of delay elements for logically combining the output signal from said active kicker enable circuit and the pulse signal with a plurality of output signals from said delay elements to generate a plurality of sequential enable signals independently from an external clock signal; and a plurality of pumping means coupled to an output line and the pumping drive means, each pumping means pumping responsive to a corresponding one of said enable signals so that a number of said pumping means are sequentially driven in a standby mode and all of said pumping means are successively driven in the active mode.

2. high voltage generating circuit for a semiconductor memory device, as set forth in claim 1, wherein said plurality of pumping means includes four pumping means.

3. A high voltage generating circuit for a semiconductor memory device, comprising:

an active kicker enable circuit for generating a master clock signal in an active mode;

a plurality of delay elements coupled to the active kicker enable circuit for sequentially performing a delay operation for a time period in response to an output signal from said active kicker enable circuit;

an oscillator for generating a pulse signal at a desired period;

pumping drive means coupled to the active kicker enable circuit, the oscillator, and the plurality of delay elements for logically combining the output signal from said active kicker enable circuit and the pulse signal with a plurality of output signals from said delay elements to generate a plurality of sequential enable signals; and a plurality of pumping means coupled to an output line and the pumping drive means for pumping an input voltage in response to the plurality of sequential enable signals from said pumping drive means, each pumping means pumping responsive to a corresponding one of said enable signals so that a number of said pumping means are sequentially driven in a standby mode and all of said pumping means are successively driven in the active mode;

wherein said pumping drive means includes:

first gating means for logically combining the master clock signal from said active kicker enable circuit with the plurality of output signals from said delay elements;

second gating means for logically combining an output signal from said first gating means with the pulse signal from said oscillator;

a shift register for generating the sequential control signals in response to an output signal from said second gating means; and a plurality of third gating means for logically combining the plurality of sequential control signals from said shift register with the output signals from one or more of said delay elements to generate the plurality of sequential enable signals, respectively.

4. high voltage generating circuit for a semicondutor memory device, as set forth in claim 3, wherein said first gating means includes a nor gate, said second gating means includes an AND gate and each of said third gating means include an OR gate.

5. A high voltage generating circuit for a semiconductor memory device, comprising:

an active kicker enable circuit for generating a master clock in an active mode;

a plurality of delay elements coupled to the active kicker enable circuit for sequentially performing a delay operation for a time period in response to an output signal from said active kicker enable circuit;

an oscillator for generating a pulse signal at a period;

pumping drive means coupled to the active kicker enable circuit, the oscillator, and the plurality of delay elements for generating a plurality of sequential enable signals in response to the output signal from said active kicker enable circuit, the pulse signal and an output signal from one of said delay elements independently from an external clock signal; and a plurality of pumping means coupled to an output line and the pumping drive means for pumping an input voltage in response to the plurality of sequential enable signals from said pumping drive means, each pumping means pumping responsive to a corresponding one of said enable signals so that a number of said pumping means are sequentially driven in a standby mode and all of said pumping means are successively driven in the active mode.

6. A high voltage generating circuit for a semiconductor memory device, comprising:

an active kicker enable circuit for generating a master clock in an active mode;

a plurality of delay elements coupled to the active kicker enable circuit for sequentially performing a delay operation for a time period in response to an output signal from said active kicker enable circuit;

an oscillator for generating a pulse signal at a period;

pumping drive means coupled to the active kicker enable circuit, the oscillator, and the plurality of delay elements for generating a plurality of sequential enable signals in response to the output signal from said active kicker enable circuit, the pulse signal and an output signal from one of said delay elements; and a plurality of pumping means coupled to an output line and the pumping drive means for pumping an input voltage in response to the plurality of sequential enable signals from said pumping drive means, each pumping means pumping responsive to a corresponding one of said enable signals so that a number of said pumping means are sequentially driven in a standby mode and all of said pumping means are successively driven in the active mode;

wherein said pumping drive means includes:

an oscillator control circuit for generating the first control signal in response to the output signal from said active kicker enable circuit and an output signal from one of said delay elements;

first gating means for logically combining the first control signal from said oscillator control circuit with the pulse signal from said oscillator;

second gating means for logically combining the output signals from one or more of said delay elements;

third gating means for logically combining output signals from said first and second gating means;

a shift register for generating a plurality of sequential second control signals in response to an output signal from said third gating means; and a plurality of pulse generators for generating the plurality of sequential enable signals in response to the plurality of sequential second control signals from said shift register, respectively.

7. A high voltage generating circuit for a semiconductor memory device, as set forth in claim 6, wherein said first gating means includes an AND gate and each of said second and third gating means includes an OR gate.

8. A high voltage generating circuit for a semiconductor memory device, comprising:

an active kicker enable circuit for generating an output signal in an active mode;

a variable oscillator for generating a pulse signal at a variable period in response to the output signal from said active kicker enable circuit;

pumping drive means for generating a plurality of sequential control signals in response to the pulse signal from said variable oscillator and generating a plurality of sequential enable signals in response to the plurality of sequential control signals;

a plurality of pumping means for pumping an input voltage in response to the plurality of sequential enable signals from said pumping drive means; and a detector connected in a feedback manner between said pumping means and said oscillator;

wherein a desired number of said pumping means are sequentially driven in a standby mode and all of said pumping means are successively driven in the active mode.

9. A high voltage generating circuit for a semiconductor memory device, as set forth in claim 8, wherein said pumping drive means includes:

a shift register for generating the plurality of sequential control signals in response to the pulse signal from said variable oscillator; and a plurality of pulse generators for generating the plurality of sequential enable signals in response to the plurality of sequential control signals from said shift register, respectively.

10. A method for generating a high voltage power supply in a semiconductor memory device having a plurality of pumping circuits, the method comprising:

generating a plurality of sequential signals independently of an external clock signal;

activating one by one of the plurality of pumping circuits responsive to a pulse which has a constant period generated by an output signal (OSC) or clock signal in a standby mode and simultaneously activating the plurality of pumping circuits responsive to the sequential signals in an active mode.

11. A method according to claim 10 further including sequentially activating the pumping circuits during the active mode.

12. A method for generating a high voltage power supply in a semiconductor memory device having a plurality of pumping circuits coupled to an output line, the method comprising:

sequentially activating the pumping circuits at a frequency during a standby mode; and simultaneously activating the plurality of pumping circuits during an active mode.

13. A circuit for generating a high voltage power supply in a semiconductor memory device, the circuit comprising:

a plurality of pumping circuits coupled to an output line, wherein each pumping circuit transfers charge to the output line responsive to a corresponding one of a plurality of enable signals; and a control circuit coupled to the pumping circuits for generating the enable signals independently of an external clock signal;

wherein one of the pumping circuits transfers charge to the output line during a standby mode, and a plurality of the pumping circuits simultaneously transfer charge to the output line during an active mode.

14. A circuit according to claim 13 wherein each of the pumping circuits is sequentially driven in the standby mode.

15. A circuit according to claim 14, wherein each of the pumping circuits includes:

a first input terminal coupled to receive an operating power supply signal;

a second input terminal coupled to receive one of the plurality of enable signals; and and an output terminal coupled to the output line.

16. A circuit according to claim 13 wherein the control circuit activates one by one the plurality of enable signals at a time during the standby mode and sequentially activates more than one of the plurality of enable signals at a time during the active mode.

17. A circuit according to claim 16 wherein the enable signal generating circuit includes a shift register coupled to the pumping circuits to activate the enable signals in sequence.

18. A circuit for generating a high voltage power supply in a semiconductor memory device, the circuit comprising:

a plurality of pumping circuits coupled to an output line, wherein each pumping circuit transfers charge to the output line responsive to a corresponding one of a plurality of enable signals; and a control circuit coupled to the pumping circuits for generating the enable signals independently of an external clock signal;

wherein one of the pumping circuits transfers charge to the output line during a standby mode, and a plurality of the pumping circuits simultaneously transfer charge to the output line during an active mode; and wherein the control circuit includes:

a delay circuit for generating one or more pulse signals, wherein each of the pulse signals is sequentially activated in the active mode;

a logic gate coupled to the delay circuit for generating a first control signal responsive to the one or more pulse signals;

an oscillator for generating a oscillating signal;

a shift register coupled to the logic gate and the oscillator, wherein the shift register generates one or more sequential control signals responsive to the oscillating signal and the first control signal; and a logic circuit coupled to the shift register and the delay circuit for combining each of the one or more pulse signals with a corresponding one of the sequential control signals, thereby generating the enable signals.

19. A circuit for generating a high voltage power supply in a semiconductor memory device, the circuit comprising:

a plurality of pumping circuits coupled to an output line, wherein each pumping circuit transfers charge to the output line responsive to a corresponding one of a plurality of enable signals; and a control circuit coupled to the pumping circuits for generating the enable signals independently of an external clock signal;

wherein one of the pumping circuits transfers charge to the output line during a standby mode, and a plurality of the pumping circuits simultaneously transfer charge to the output line during an active mode; and wherein the control circuit includes:

a delay circuit for generating one or more pulse signals, wherein each of the pulse signals is sequentially activated in the active mode;

an oscillator control circuit coupled to the delay circuit for generating a first control signal responsive to two of the pulse signals;

an oscillator for generating a oscillating signal;

a logic circuit coupled to the delay circuit and the oscillator control circuit for generating a clock signal responsive to the oscillating signal, the first control signal, and the one or more pulse signals;

a shift register coupled to the logic circuit, wherein the shift register generates one or more sequential control signals responsive to the clock signal; and one or more pulse generators coupled to the shift register, each pulse generator generating one of the enable signals responsive to a corresponding one of the sequential control signals.

20. A circuit for generating a high voltage power supply in a semiconductor memory device, the circuit comprising:

a plurality of pumping circuits coupled to an output line, wherein each pumping circuit transfers charge to the output line responsive to a corresponding one of a plurality of enable signals; and a control circuit coupled to the pumping circuits for generating the enable signals independently of an external clock signal;

wherein one of the pumping circuits transfers charge to the output line during a standby mode, and a plurality of the pumping circuits simultaneously transfer charge to the output line during an active mode; and wherein the control circuit includes:

an active kicker enable circuit for generating an active kicker enable signal in an active mode;

a variable oscillator coupled to the active kicker enable circuit for generating a clock signal responsive to the active kicker enable signal, wherein the variable oscillator changes the frequency of the clock signal responsive to the active kicker enable signal;

a shift register for generating one or more sequential control signals responsive to the clock signal; and one or more pulse generators coupled to the shift register, each pulse generator generating one of the enable signals responsive to a corresponding one of the sequential control signals.

* * * * *

UNITED STATES PATENT AND TRADEMARK OFFICE
CERTIFICATE OF CORRECTION

PATENT NO.   : 5,982,222
DATED        : November 9, 1999
INVENTOR(S)  : Kyung

It is certified that error appears in the above-identified patent and that said Letters Patent is hereby corrected as shown below:

Column 7,
Line 39, "PO, 10 thereby" should read -- PO, thereby --.

Column 9,
Line 21, "2. high voltage" should read -- 2. A high voltage --.
Line 66, "4. high voltage" should read -- 4. A high voltage --.

Column 10,
Line 1, "a nor gate" should read -- a NOR gate --.
Line 3, "include an" should read -- includes an --.

Signed and Sealed this

Twelfth Day of November, 2002

Attest:

*Attesting Officer*

JAMES E. ROGAN
*Director of the United States Patent and Trademark Office*